United States Patent [19]
Brost et al.

[11] Patent Number: 5,739,670
[45] Date of Patent: Apr. 14, 1998

[54] METHOD FOR DIAGNOSING BATTERY CONDITION

[75] Inventors: Ronald David Brost, Fishers; Michael Scott Sullivan; Tracy Frye Strickland, both of Noblesville, all of Ind.

[73] Assignee: General Motors Corporation, Detroit, Mich.

[21] Appl. No.: 741,742

[22] Filed: Oct. 31, 1996

[51] Int. Cl.$^6$ .......................... H01M 10/46; H01M 10/44
[52] U.S. Cl. .................................. 320/14; 320/43; 320/48
[58] Field of Search .................................. 320/14, 15, 21, 320/22, 30, 35, 39, 43, 44, 48; 324/427, 432, 433; 340/636; 429/90, 61

[56] References Cited

U.S. PATENT DOCUMENTS

| | | | |
|---|---|---|---|
| 4,234,840 | 11/1980 | Konrad et al. | 320/48 |
| 4,677,363 | 6/1987 | Kopmann | 320/44 |
| 5,504,415 | 4/1996 | Podrazhansky et al. | 320/18 |
| 5,578,915 | 11/1996 | Crouch, Jr. et al. | 320/48 |
| 5,614,804 | 3/1997 | Kayano et al. | 320/48 X |

*Primary Examiner*—Edward Tso
*Attorney, Agent, or Firm*—Vincent A. Cichosz

[57] ABSTRACT

A method for diagnosing the general condition of a battery module in a string of such modules comprising a battery pack monitors voltage, current and temperatures of the modules and battery pack. Accumulators account for various charge quantities including charge out and net charge used for the battery pack as well as discharge period durations. State of charge is provided by appropriate means and used to update module capacities. The various charge and time accumulators are used to derive depth of discharge and discharge rate information providing inputs to predetermined functions for determining a simple scalar outputs directly indicative of the general condition of the modules.

8 Claims, 2 Drawing Sheets

5,739,670

METHOD FOR DIAGNOSING BATTERY CONDITION

TECHNICAL FIELD

The present invention is related to battery monitoring and more particularly to determining the condition or relative useful life of a battery with respect to operational and environmental exposures.

BACKGROUND OF THE INVENTION

In applications employing secondary electrochemical energy storage devices such as a battery pack including a plurality of individual battery modules, it is particularly desirable to provide a simple and reliable indication of the condition of individual battery modules. Such information may be used for example to head off incipient failure of battery modules which are indicated as being in poor condition due to normal degradation or other factors contributing to premature degradation.

Multiple battery modules in a series string provide a challenge in controlling recharging and discharging, and diagnosis. Common strategies assume identical battery module capacities, temperatures and states of charge, but variations in history originating from the manufacturing process will introduce some variance between any set of battery modules. This problem is particularly significant when there are a large number of battery modules in a battery pack.

It is commonly observed that battery modules under normal service will diverge even further from their original state. This occurs since the lower capacity battery modules will be discharged deeper than their counterpart battery modules in the string. Assuming the most widely employed general type of battery module, aqueous lead-acid, the deeper discharge results in greater sulfation, which promotes gassing during recharge and subsequent advanced aging in those battery modules. The pattern continues until the weaker battery modules fail prematurely. This scenario does not consider the additional problems of pack rework, where single, unmatched battery modules are replaced, or pack temperature gradients, which will lead to significant capacity variations.

During the latter stages of discharge, the slope of the voltage-time curve becomes highly negative. However, if one battery module is weaker than the rest in a string, the voltage for that battery module will drop off faster, and well before, the pack average. The rate of change of voltage with respect to time (dV/dt) for a single battery module event will be the same for single battery modules as it is in longer strings, but the signal to noise ratio for a string will be depressed proportionally to the number of battery modules in the string. This leads to difficulties in discriminating the end of discharge of a significantly lower capacity battery module from the normal battery module noise, and discharge may be allowed to continue well beyond the life-capacity optimum of that battery module. In a series pack, the battery module may even be reversed, where the counterpart battery modules drive a charging reaction on opposing electrodes. The loss of capacity may be sufficient to render the pack subsequently unusable.

Module imbalances may also cause problems during charging. Charging is normally based on the average voltage, so that charging a string containing a low capacity battery module will result in that battery module being driven to undesirably high voltages. This will lead to high gassing rates, which is a precursor to premature battery module failure. Recognition of low capacity battery modules would be assured if voltages were monitored on a cell level; however, practical considerations preclude such extensive data acquisition. A common compromise is to monitor discharges on individual battery modules.

One example of secondary battery applications which would benefit from a simple and reliable indication of individual battery module condition is electric vehicle applications. Electric vehicle applications perhaps present the overall most challenging environment for providing an accurate and simple indication of battery module condition due to the widely varying conditions which a vehicle is likely to be exposed to, including ambient temperature extremes, dynamic discharge currents, relatively deep discharges, frequent recharges, and incomplete charging cycles. Electric vehicles conventionally employ a series string of individual battery modules wherein the weakest or least capable battery module is generally considered to be the determining factor in the advisability of obtaining battery pack service. In such applications, it is particularly desirable to indicate to a vehicle operator the propriety of obtaining timely service of the battery pack based upon less than adequate condition of one or more individual battery modules.

Known methods of determining the need for battery pack service are generally incapable of predicting imminent failure and rely predominantly upon battery module replacement history, and/or regular service schedules based on time or miles driven. Such methodology is fraught with substantial likelihood of mis-diagnosis and unnecessary or incomplete battery module replacements.

SUMMARY OF THE INVENTION

Therefore, it is an object of the present invention to determine simply and reliably the condition of each battery module in a battery pack.

It is a further object to determine the condition of each battery module in accordance with a variety of performance affecting factors from among such factors as cycle experience, depth of discharge, power demands, memory effects, and low voltage excursions.

Yet another object of the present invention is to provide an indication of the conditions of the individual battery modules of a battery pack as a simple scalar quantity whose magnitude is generally indicative of the condition of the respective battery module.

These and other objects of the present invention are provided for by monitoring module voltages, pack current and battery pack temperature. The monitored parameters are temperature compensated in the case of module voltages and filtered to alleviate the effects of transient conditions. During periods in which the battery pack is being discharged, that is to say during periods of net reductions in module charge, the charge removed is accounted for in a charge out accumulator and the module state of charge is updated by an appropriate technique. The pack charge used is accounted for in a charge used accumulator which accounts for both charge into and out of the pack by accumulating the charge and discharge during discharge periods and charge periods. The duration of discharge periods is accounted for in a time accumulator. Module capacity is updated during discharge periods in accordance with the updated state of charge and charge used accumulator. Preferably, the time accumulator and the charge out accumulator do not reset until the battery pack is brought up to a full charge.

Module depth of discharge is calculated from the charge out accumulator and the module capacity. Similarly, module discharge rate is calculated from the charge out accumulator and the time accumulator. A predetermined function of the module depth of discharge and module discharge rate is used to return a scalar value which is indicative of the relative general condition of the module.

In accordance with another aspect of the invention, low battery module voltage events are determined for individual modules when the module voltage falls below a predetermined current compensated threshold indicative of irreversible module damage. A running count of such events is maintained and utilized as a further factor in decrementing the general condition of the module.

BRIEF DESCRIPTION OF THE DRAWINGS

The present invention will now be described, by way of example, with reference to the accompanying drawings, in which.

DESCRIPTION OF THE PREFERRED EMBODIMENT

The preferred embodiment described as follows is with respect to an electric vehicle application. Other applications may similarly benefit from the present invention and include such applications as hybrid electric vehicles and stand alone battery energy storage systems.

In accordance with the present exemplary embodiment and implementation in an electric vehicle, a battery pack for use in an electric vehicle includes twenty-six (26) series connected twelve (12) volt vent regulated lead acid (VRLA) battery to provide a 312 volt motive voltage source as measured across the extreme ends of the arrangement. The series arrangement of batteries is hereafter referred to as battery pack and each individual VRLA battery in the battery pack may hereafter be referred to interchangeably as battery module, battery or battery module. All such references prior to this point in this disclosure to battery pack and battery module are to be given similar meaning. An exemplary 12 volt VRLA battery module for practicing the present invention is commercially available from General Motors Corporation, Delphi Automotive Systems, and may be identified by part number 19010704. The identified VRLA battery module has a typical capacity of 53 Ah. as determined at a 25 A discharge rate at 27° C. and a maximum current range of 400 A discharge to 250 A recharge. Operating temperature of the identified battery module is from substantially—18° C. to 55° C. at discharge and from substantially 5° C. to 50° C. at recharge. Current compensated voltage minimum is specified at substantially 10.5 V per battery module.

Figure 1:
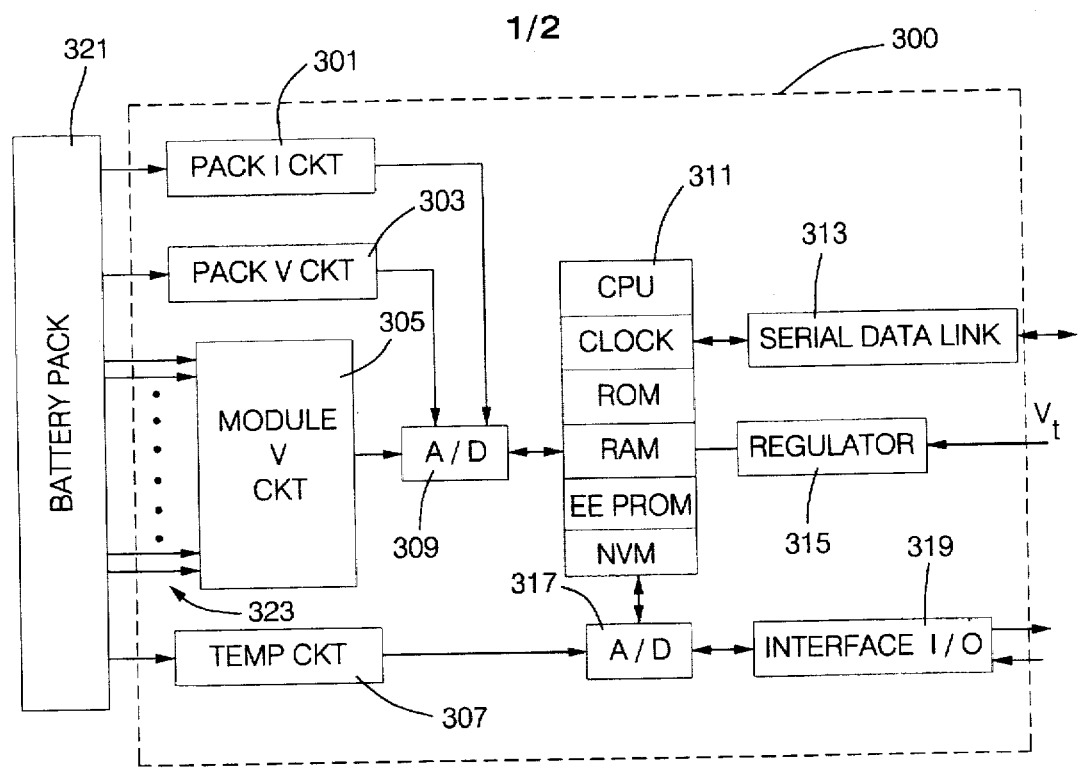
FIG. 1 is a schematic representation of computer based controller for use in implementing the determination of battery module condition in accordance with the present invention.
Figure 3:
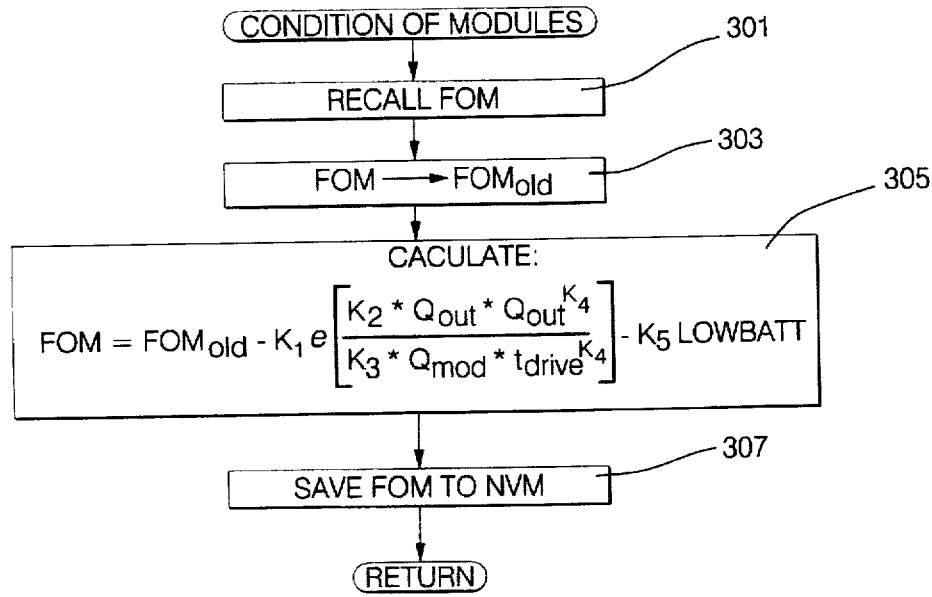
FIG. 3 is a flow chart representing various exemplary steps executed by the controller of FIG. 1 for carrying out the present invention in accordance with a preferred implementation.
Figure 2:
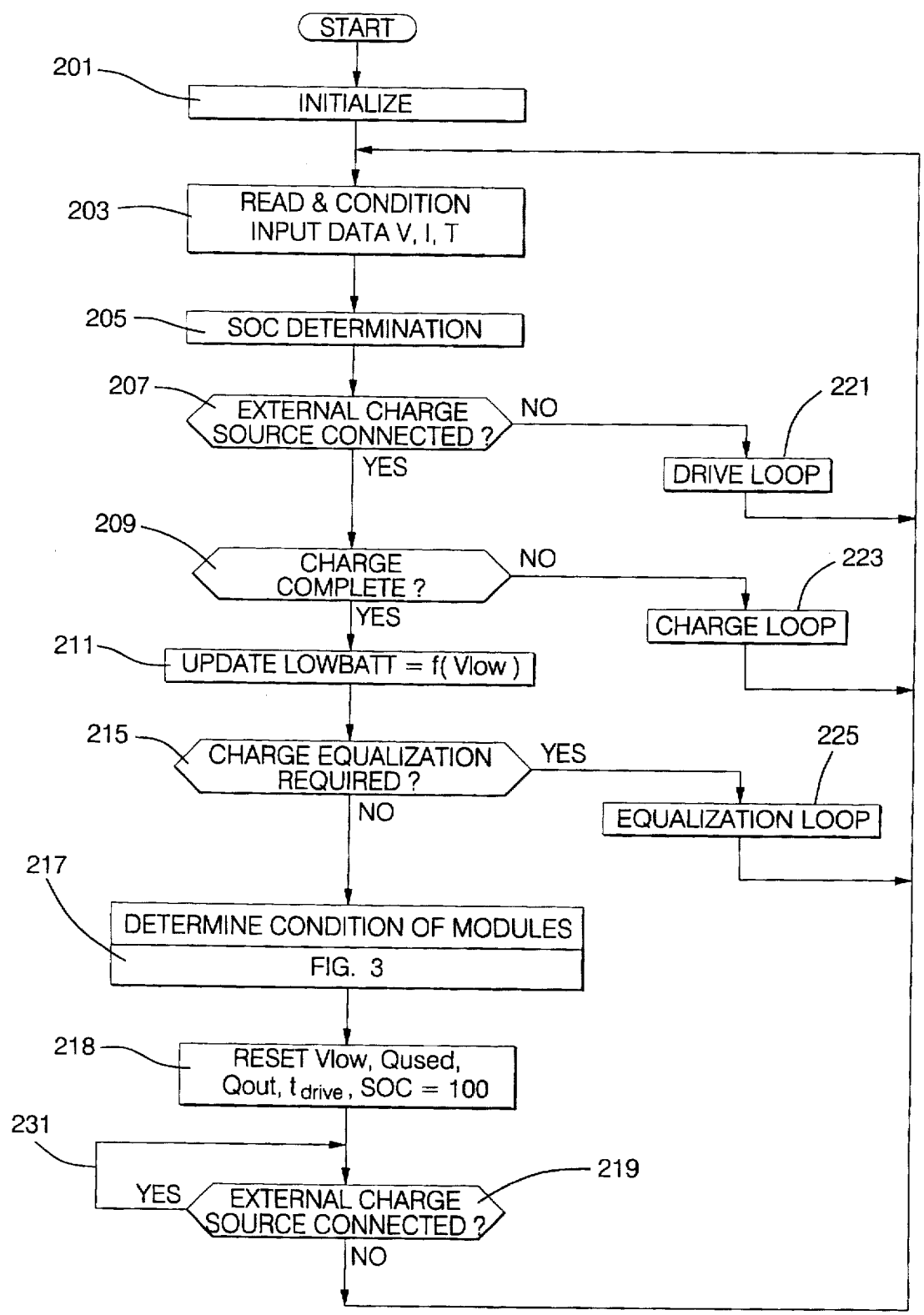
FIG. 2 is a flow chart representing various exemplary steps and routines executed by the computer based controller of FIG. 1 for carrying out the present invention in an electric vehicle.

With reference now to FIG. 1, a computer based controller suitable for implementation of the present invention embodied in the computer instruction sets illustrated by the flow diagrams of FIGS. 2 and 3 is illustrated. Controller 300 comprises a conventional microprocessor based computer 311 including central processing unit (CPU), read only memory (ROM), random access memory (RAM), electrically programmable read only memory (EPROM), non-volatile or keep-alive memory (NVM) and high speed internal clock. The controller is powered via a peripheral, non-motive voltage source (V+) which is scaled and regulated by regulator 315. The controller is shown interfaced with battery pack 321 and is adapted to monitor battery pack quantities such as individual battery module voltages via lines 323 and battery module voltage circuit 305, bakery pack current through pack current circuitry 301, battery pack voltage via battery pack voltage circuitry 303, and battery pack temperature via battery pack temperature circuitry 307. Module voltage circuitry 305 provides multi-channel scanner/voltmeter functions having an analog output for conversion to digital data by way of analog to digital converter 309. In operation, the voltages of the individual battery modules are scanned and digitized, one at a time, and read into appropriate temporary registers of RAM. Similarly pack current and pack voltage are scanned, convened, and read into temporary RAM locations. Battery pack temperature, comprising one or more inputs for example from strategically placed thermistors in the battery pack, is scanned, digitized and read into temporary RAM locations. The interface input/output comprises discrete control signals which provide for external interface with vehicle systems, for example a battery charger. Serial data link comprises a high speed data communication bus which communicates with other vehicle systems, for example a vehicle system controller. A preferred controller as generally described and illustrated is available from Delco Electronics Corporation and is generally referred to as a battery pack monitor (BPM).

The ROM of the controller 300 has a resident set of computer instructions for execution by the microprocessor for basic input and output functions including the pack monitoring and acquisition of voltage, current, and temperature data. The EPROM contains further instruction sets for implementing specific control, data manipulation and communication functions including those associated with the implementation of the battery condition determination performed in accord with the present invention.

Specific sets of program instructions for execution by the controller of FIG. 1 in carrying out the diagnostic functions of the present invention are illustrated in FIGS. 2 and 3. In FIG. 2, the set of instructions represented by the flow chart is executed at any time the BPM is powered up. In the case of the present example wherein an electric vehicle is concerned, the BPM is powered any time the vehicle is motively operable such as when an operator places a key in an cylinder and actuates the key into a run position. Similarly, the BPM is powered any time the vehicle is being recharge by a remote charging station, such power up being triggered by appropriate interface of the vehicle with the remote charging station.

The present invention is performed with respect to a plurality of individual battery modules and as such standard matrix notations may be utilized in the figures and text to follow. Where variables are shown in bold type face a matrix of appropriate dimension is represented. For example, the notation representing a matrix of temperature compensated filtered battery module voltages as described below is Vmod. Furthermore, in accordance with the preferred implementation in an electric vehicle, three main control loops are provided as later described. Generally, however, only one control loop at a time is effective to carry out its particular functions. Control loop routing may be provided by flags as later described. All of the control loops share at least portions of data acquisition instruction sets embodied in block 203 of the flow diagram and at least portions of state of charge determination instruction sets embodied in block 205 of the flow diagram. Other instruction sets in both blocks 203 and 205 may be reserved for execution by one or the other of the various control loops then active and hence suspended for the other control loops not then active. These various instruction sets that are particular to certain of the control loops will be definitively set forth and identified as appropriate.

Beginning with block 201, a series of program steps are executed upon the initial power up of the BPM 300. The series of program steps represented by the initialization block 201 are effective to set the various registers, counters, flags, timers and variables for use by the remaining repetitively executed instruction sets corresponding to blocks 203–225 for carrying out the present invention. The initialization block 201 is effective to read into predefined memory locations data from non-volatile memory corresponding to battery pack history which may be updated during the drive and/or charge cycles in the following steps. Furthermore, initialization block 201 represents program steps for recognizing service information which may be provided by way of the serial data link by a servicing technician and conventional interface diagnostic tool. The service information would preferably contain positional information indicative of which battery modules if any were replaced during the most recent service performed. If the battery pack is unchanged with respect to battery modules, the historical data stored in NVM for all battery modules provides initial values by way of the interfaced diagnostic tool. If the battery pack is changed with respect to one or more battery modules, variables corresponding to the replaced battery modules are initialized with new battery module values. In this way, the BPM is always refreshed with service information after service is complete such that the characteristic differences in operation between new replacement battery modules and the counterpart battery modules of the battery pack are accounted for in the future execution of the remaining instruction set. The invention is therefore seen to accommodate new pack or refurbished pack conditions, where all or some of the battery modules have been replaced. In these cases, selected data must be extracted via the I/O port and replaced with initial values.

Moving on to block 203, a set of instructions for reading into working memory locations unconditioned battery module voltages V, unconditioned pack current I and unconditioned temperatures T. Ideally, unconditioned temperatures T are temperature measurements made at the battery module level such as by a plurality of insulated thermistors having a one to one correspondence to the pack modules. However, such arrangement is generally not practical so a predetermined number of strategically placed thermistors are employed to generally represent the temperatures of certain groups of battery modules within the battery pack. Conditioning of the inputs is also accomplished in the block labeled 203 and comprises averaging of individual temperature measurements T to produce an average pack temperature Tav. Unconditioned battery module voltages are temperature compensated in accordance with the difference between the unconditioned pack temperature T and a calibrated reference temperature, and a calibrated gain in accordance with well known compensation techniques. The temperature compensated individual battery module voltages are filtered such as by a sliding window filter which pushes the oldest respective voltage measurement off of a predimensioned stack while adding the most recently acquired and temperature compensated respective battery module voltage thereto. Other filtering techniques which effectuate the objective of reducing deleterious transient effects may similarly be employed. The respective stack arrays are then algebraically averaged to arrive at respective temperature compensated filtered battery module voltages Vmod. Similarly, unconditioned pack current is filtered by a sliding window filter and algebraically averaged to arrive at a filtered pack current Iav. States of low battery module voltage flags, Vlow, are determined by the steps of block 203. Low voltage flags are set for battery module voltages which exhibit an undesirably low current compensated voltage which is effectively indicative of an undesirable battery module condition. For example, in the exemplary embodiment wherein VRLA batteries are utilized, discharge of a battery module to a current compensated voltage of less than substantially 10.5 volts significantly increases the likelihood of irreversible conversion of the active battery material, lead oxide, to lead sulfate due to pinch-off or isolation effects as well known in the art. A drop in capacity proportional to the damage would result. Preferably, a low voltage flag is set for any battery module which exhibits a current compensated voltage substantially corresponding to an extreme depth of discharge, for example 80% depth of discharge, as empirically determined for example as a function of current compensated battery module voltage. Additionally, the instruction set at block 203 is effective to determine the incremental time Δt which elapsed since the previous execution of block 203.

Block 205 next represents the instruction set for determining the battery module state of charge and pack state of charge. In accordance with a preferred method of determining the state of charge of battery modules, an amp hour integration is performed upon the previously determined average pack current Iav. The pack charge used, Qused, is defined in accord with the convention that charge decreases with discharge of the pack and that charge increases during charging of the pack through external means or by way of regenerative braking of the vehicle.

$$Qused = Qused + Iav * \Delta t \quad (1)$$

During the drive loop only, as determined in the present example by a flag indicating that an external charge source is connected, the charge out of the battery pack, that is to say only discharge currents, is also cumulated as Qout.

$$Qout = Qout - Iav * \Delta t \quad (2)$$

When the value of Iav is less than a predetermined negative threshold representative of a level of pack discharge experienced during vehicle "idle" conditions to account for certain parasitic current draws from the battery pack, a cumulative cycle drive timer $t_{drive}$ is incremented by the incremental time Δt.

$$t_{drive} = t_{drive} + \Delta t \quad (3)$$

The program steps of block 205 then proceed to calculate the state of charge of each battery module and the overall pack state of charge.

The state of charge is calculated through a series of empirical formulae. An exemplary method for calculating the state of charge is disclosed in U.S. patent application Ser. No. 08/311,991, also assigned to the assignee of the present invention. Generally, a determination is made relative to the magnitude of the average pack current Iav and a battery module voltage Vmod threshold as a function of the average pack current Iav. If Iav is outside predetermined current limits, or if the battery module voltage Vmod exceeds a voltage threshold corresponding to a minimally discharged battery module, then the state of charge is calculated through conventional amp hour integration techniques as shown below. This form of state of charge calculation is the exclusive form used during the charge loop regardless of current and voltage conditions.

$$SOC = SOCold + [(I_{av} * \Delta t)/Qmodold] * 100 \quad (4)$$

wherein SOC is the current battery module state of charge, SOCold is the most recent historical battery module state of charge, Qmodold is the most recent historical available capacity of a fully charged battery module. The incremental charge term, Iav*Δt, is divided by the most recent measure of available capacity of a fully charge battery module to provide a unitless fractional contribution to the total state of charge. Expression of the state of charge in percentages from 0 to 100% requires multiplication of the unitless fractional contribution by 100 as shown. The conventional amp hour integration corresponds substantially to nominally discharged battery modules, for example above 80% state of charge wherein the voltage is relatively inelastic with respect to capacity.

Only during the drive loop, if Iav is inside of the current limits, the state of charge is determined from one of two mixed polynomial functions of pack current Iav and battery module voltage Vmod. Generally, the selection of the one of the polynomial functions used in the calculation of the state of charge depends upon the state of charge of the battery module as determined by appropriate empirically determined current-voltage relationships. That is to say, a first function $$SOC = A1*Iav + B1*Vmod + C1*Iav*Vmod + D1 \quad (5)$$

is used when the state of charge is substantially between a nominal and deep discharge, such as for example 80% and 20% state of charge and a second function $$SOC = A2*Iav + B2*Vmod + C2*Iav*Vmod + D2*Vmod^2 + E \quad (6)$$

is used when the state of charge is below the deep discharge (e.g. 20% state of charge). In the equations (5) and (6) above representing polynomial function to define state of charge, coefficients A1, B1, C1, D1, A2, B2, C2, D2 and E all are determined with commonly used multi-variable regression techniques while applying the general equation forms to empirically collected data sets of Iav and Vmod and SOC in accord with well known calibration processes.

Alternative methods for providing a state of charge may also be employed without detracting from the present method of determining the battery modules condition. For example, U.S. patent application Ser. No. corresponding to Attorney Docket No. H-196695 titled "METHOD AND APPARATUS FOR DETERMINING BATTERY STATE OF CHARGE USING NEURAL NETWORK ARCHITECTURE" and also assigned to the assignee of the present invention discloses a state of charge determination method utilizing a minimal neural network architecture. Other expert systems are envisaged by the inventors and it is intended that such alternative provisions of state of charge be fully applicable to the present invention.

An important part of the instruction set comprising the state of charge determination block 203, the individual battery module capacities, Qmod, of the battery modules are updated based upon the newly determined state of charge SOC and the pack charge used, Qused as shown below.

$$Qmod = \left| \frac{Qused}{\left(1 - \frac{SOC}{100}\right)} \right| \quad (7)$$

Wherein the denominator represents the fractional charge removed from the battery module based upon the updated state of charge previously calculated or provided. The update of individual battery module capacities, Qmod, occurs only during the drive loop when the effective capacity is known to depend greatly upon the discharge characteristics and will therefore account for the present discharge conditions.

Block 207 next determines the state of a charge source connected flag. A reset flag indicates that the charge source is disconnected and that the drive loop is active. Specific functions performed during the drive loop are represented by block 221 of the figure. In the drive loop, a voltage lid may be determined to limit detrimentally high battery module voltages due to the limitation of the battery modules to accept regenerative braking currents. Other ancillary functions which affect discharge management are also included in the drive loop.

Block 209 determines the state of a charge complete flag. The charge complete flag is not set until a charging sequence has been fully performed as described later. A reset flag routes control to the charge loop specific instruction set associated with block 223. Generally, the charge loop instruction set is effective to control the battery pack recharge in accordance with a predetermined recharge methodology. For example, a preferred recharge method comprises a series of stepped current level requests invoked in response to predetermined voltage lids. The charge complete flag is set only when a predetermined minimum current is requested or the amount of charge exceeds a predetermined overcharge threshold. Hence, an early termination of a charge, such as through operator intervention, will not result in a set charge complete flag and execution of certain instruction sets associated with attaining a complete recharge. Other charge loop functions may include battery pack temperature checks for use in modifying charge current requests for purposes of thermal management.

Upon charge completion as determined by a set charge complete flag at block 209, the instructions associated with blocks 211 and 215 are executed. Block 211 performs an update to a low battery module voltage event counter, LOWBATT, in accordance with the state of the low battery module voltage flags, Vlow, as previously determined through the data acquisition and conditioning steps of block 203. LOWBATT is incremented to account for deeply discharged battery module events which are known to produce irreversible battery damage and reduce the available active material in the battery module.

Block 215 next determines whether an equalization of the battery modules is required by the state of a charge equalization required flag. Generally, the charge equalization required flag is set thus requesting an equalization charge based upon certain historical considerations of the battery pack such as total amp hours removed from the pack which may be provided in an appropriate accumulator, differences in battery module voltages in excess of a desired magnitude, and cycle or service history of the battery pack. In the equalization loop instruction set at block 225, a predetermined equalization current is supplied to the battery pack to bring all battery modules up to substantially the same level of charge as is well known in the art to be desirable.

Upon the end of the equalization charge loop as indicated by a reset charge equalization flag, the instruction sets associated with blocks 217 and 218 are executed. The instruction set of block 217 is detailed in the flow diagram of FIG. 3 and returns an updated condition of the battery modules. After determination of the condition of the battery modules at block 217, block 218 represents execution of instructions for resetting certain variables and flags. The low battery module voltage flags, Vlow, are reset. The charge accumulators charge out (Qout) and pack charge used (Qused) are also reset to zero. Additionally, following the completed charge, the cumulative cycle drive timer $t_{drive}$ is reset to zero. At this point, after any necessary charge equalization, the state of charge, SOC, is set to 100 indicating full capacity.

Block 219 next represents a wait in change of vehicle operational status from being charged to being driven such as by checking the external charge source connected flag. A set flag essentially results in a wait condition indicated by the return line 231. Disconnection of the charge source results in a reset of the external charge source flag and return to block 203 for data acquisition and conditioning in accordance with the drive loop.

Referring now to FIG. 3, a flow chart representing specific instruction sets for determining the condition of the individual battery modules is set forth. A "figure of merit", hereafter FOM, is defined herein as a simple scalar for each battery module, the value of which indicates the relative condition or useful life of the respective battery module. In the present exemplary embodiment, FOM ranges from 0 to 10 although any desired scaling may be used. A FOM of a new battery module is set at 10 whereas a FOM of a spent or minimally effective battery module is substantially zero. The routine is referenced by block 217 of the previously described flow chart of FIG. 2.

First, block 301 recalls from memory the most recent historical values for FOM. These values were calculated and stored during the most recent past completion of a charge and stored in non-volatile memory. Block 303 next moves the historical FOM into working registers FOMold.

The FOM is then calculated by a set of instructions represented by calculation block 305 of the figure. In accordance with a preferred calculation of FOM, the following simplified expression is employed:

$$FOM = FOMold - K_1 \cdot e^{\left(\frac{K_2 \cdot Qout^{(1+K_4)}}{K_3 \cdot Qmod \cdot t_{drive}^{K_4}}\right)} - K_5 \cdot LOWBATT \quad (8)$$

As can be seen by inspection, the preferred FOM expression contains non-linear and linear terms. The non-linear term comprises an exponential term $$\left(\frac{K_2 \cdot Qout^{(1+K_4)}}{K_3 \cdot Qmod \cdot t_{drive}^{K_4}}\right)$$

that when expanded out exposes some of some critical features of the present invention as follows:

$$\left(\frac{K_2 \cdot Qout^{(1+K_4)}}{K_3 \cdot Qmod \cdot t_{drive}^{K_4}}\right) = K_2 \left(\frac{Qout}{Qmod}\right) \frac{1}{K_3} \left(\frac{Qout}{t_{drive}}\right)^{K_4} \quad (9)$$

wherein $$\left(\frac{Qout}{Qmod}\right)$$

represents the most recent discharge cycle depth of discharge based upon adjusted battery module capacities, $$\left(\frac{Qout}{t_{drive}}\right)$$

represents the most recent discharge cycle charge removal rate. $K_2$, $K_3$ and $K_4$ represent coefficients which are used to weight the individual contributions of the appropriate terms and are determined with commonly used multivariable regression techniques well known to those skilled in the art. Capacity losses, and hence degradation in the general condition of the battery module, results in accord with known relationships to depth of discharge and charge removal rate. As earlier described with respect to low voltage events, some irreversible material conversion may be associated with a battery module discharge. All discharges have the tendency to irreversibly convert active battery material thereby reducing the amount of active material available for reaction and hence reducing the battery module capacity. Extremely deep discharges, such as those associated with low voltage events, however, additionally exhibit isolation of otherwise active material by pinching off electrolyte access thereto. Hence, the depth of discharge term accounts for the material conversion effects more so than the pinch off effects which are accounted for by the low battery module voltage event counter. Charge removal has temporal and durable effects on capacity of the battery modules. Generally, it is well understood that the capacity of a battery module at a high rate of discharge is not as great as the capacity of the same battery module at a lower rate of discharge. Mainly this is understood to be due to surface sulfation effects and electrolyte diffusion time constants. Earlier coating of the active material at higher discharge rates leads to active material shedding and hence to premature capacity loss. Hence, the discharge rate term accounts for such accelerated degradation in the life of the battery module.

The calibration terms $K_1$–$K_5$ are chosen such that the FOM reaches a minimal value substantially in accordance with a predetermined percentage of nominal battery module capacity. Generally, a battery module is considered to be at the end of its useful life when its capacity is reduced to 80% of its nominal capacity.

As seen from the general preferred form of the expression (8) for FOM calculation, the previously calculated FOMold is decremented by a non-linear term determined as a function of the effects of the most recent discharge cycle depth of discharges based upon adjusted battery module capacities, and the most recent discharge cycle charge removal rate. It is noted here that the cycle time accounted for in the accumulated time $t_{drive}$ is not reset, nor are the charge accumulators, unless a complete recharge has been accomplished. Therefore, incomplete recharges between drive loops will account for the effects of incomplete material conversion through the depth of discharge term.

In the preferred implementation, the low battery module voltage event counter, LOWBATT, is weighted by $K_5$ to provides a measure of degradation of the battery module condition due to low battery module voltage events proportional thereto. This linear term is therefore seen to decrement the FOM in proportion to the number of irreversible low battery module voltage events encountered over the life of the battery module. Alternative implementation may do away with the low battery module voltage event counter where adequate performance based solely upon the depth of discharge and discharge rate terms.

Block 305 is followed by storing the newly updated FOM into non-volatile memory.

While the present invention has been described by way of certain preferred embodiments, such embodiments are intended to be taken by way of example and not of limitation. It is envisioned that certain modifications, improvements and alternatives may be apparent to one practicing ordinary skill in the art and that such modifications, improvements and alternatives are intended to be fully within the scope of the invention as defined in the appended claims.

We claim:

1. A method for diagnosing the relative general condition of a rechargeable electrochemical module undergoing discharge periods interposed with charge periods, wherein said discharge periods reduce net module charge and said charge periods increase net module charge, comprising the steps:

subsequent to discharge periods;
providing module depth of discharge,
providing module rate of discharge, and
calculating a scalar value as a predetermined function of said module depth of discharge and discharge rate wherein said scalar value provides a direct indication of the relative general condition of the module.

2. The method for diagnosing the relative general condition of a rechargeable electrochemical module as claimed in claim 1 further comprising the step:

during discharge periods, detecting a predetermined module voltage condition;
wherein said predetermined function further includes the detection of said module voltage condition.

3. The method for diagnosing the relative general condition of a rechargeable electrochemical module as claimed in claim 1 wherein the step of providing module depth of discharge comprises the steps:

providing module capacity;
determining charge removed from the module by accumulating discharges during discharge periods;
calculating module depth of discharge as the ratio of said determined charge removed to said module capacity.

4. The method for diagnosing the relative general condition of a rechargeable electrochemical module as claimed in claim 1 wherein the step of providing module rate of discharge comprises the steps:

determining charge removed from the module by accumulating discharges during discharge periods;
determining elapsed time during discharge periods;
calculating module rate of discharge as the ratio of said determined charge removed to said elapsed time.

5. The method for diagnosing the relative general condition of a rechargeable electrochemical module as claimed in claim 1 wherein the step of providing module depth of discharge comprises the steps:

providing module capacity;
determining charge removed from the module by accumulating discharges during multiple discharge periods characterized by interposed recharge periods that fail to fully recharge the module; and
calculating module depth of discharge as the ratio of said determined charge removed to said module capacity.

6. The method for diagnosing the relative general condition of a rechargeable electrochemical module as claimed in claim 2 wherein the step of detecting a predetermined module voltage condition comprises detecting a module voltage below a predetermined current compensated voltage threshold.

7. A method for diagnosing the relative general condition of a rechargeable electrochemical module undergoing discharge periods interposed with charge periods, wherein said discharge periods reduce net module charge and said charge periods increase net module charge, comprising the steps:

determining charge removed from one complete charge period characterized by full charge restoral to the module to the next complete charge period characterized by full charge restoral to the module;
determining net charge removed from the module between complete charge periods characterized by full charge restoral to the module;
updating a module state of charge during the discharge periods;
calculating module capacity during the discharge periods as a predetermined function of said updated state of charge and said net charge removed from the module; and
calculating a loss value as a predetermined function of said net charge removed from the module and said module capacity wherein said loss value represents incremental degradation of the relative general condition of the module.

8. The method for diagnosing the relative general condition of a rechargeable electrochemical module as claimed in claim 7 further comprising the steps:

monitoring module voltage to detect a current compensated module low voltage condition indicative of irreversible module capacity loss; and,
calculating said loss value additionally as a predetermined function of said detected current compensated module low voltage condition.

* * * * *